United States Patent [19]
Gustafson

[11] Patent Number: 5,021,755
[45] Date of Patent: Jun. 4, 1991

[54] N-WAY SIGNAL SPLITTER WITH ISOLATED OUTPUTS

[75] Inventor: Warren H. Gustafson, Freehold, N.J.
[73] Assignee: Radio Frequency Systems, Inc., Marlboro, N.J.
[21] Appl. No.: 433,141
[22] Filed: Nov. 8, 1989
[51] Int. Cl.⁵ .......................... H01P 5/12; H03H 7/48
[52] U.S. Cl. ....................................... 333/128; 333/136
[58] Field of Search ................ 333/128, 127, 136, 125

[56] References Cited
U.S. PATENT DOCUMENTS

| | | | |
|---|---|---|---|
| 3,422,377 | 1/1969 | Vient | 333/128 X |
| 3,529,265 | 9/1970 | Podell | 333/127 |
| 4,556,856 | 12/1985 | Presser | 333/128 X |
| 4,737,747 | 4/1988 | Henderson et al. | 333/128 X |
| 4,835,496 | 5/1989 | Schellenberg et al. | 333/128 |

Primary Examiner—Benny Lee
Attorney, Agent, or Firm—Peter C. Van Der Sluys

[57] ABSTRACT

An n-way signal splitter having isolated outputs with a printed circuit board geometry providing the necessary crossovers with impedance lines, running under and orthogonal to resistive components, fabricated in microstrip on one side of the board, with a ground plane completely covering the other side, requiring no feedthrough holes or jumper cables to provide the necessary crossovers, and input and output connectors being fastened directly to the printed circuit board.

14 Claims, 6 Drawing Sheets

N-WAY SIGNAL SPLITTER WITH ISOLATED OUTPUTS

BACKGROUND OF THE INVENTION

1. Field of the Invention

The present invention relates to RF signal splitters and, more particularly, to an n-way signal splitter having isolated outputs fabricated on one side of a printed circuit board with a ground plane completely covering the opposite side.

2. Description of the Prior Art

Radio frequency (RF) signal or power dividers are used in the electronics industry as a method of splitting one input signal line into a plurality of output signal lines, the output signal lines retaining the same signal characteristics, such as frequency and spectral purity, as the input signal. The output signals retain these characteristics but have a lower power level than the input signal. The power reduction per channel is relative to the ratio of input ports, one, to output ports, "n". Theoretically, any number, n, of output ports can be derived but is constrained by practical considerations such as the physical size of the device.

The accustomed practice for dividing a specified signal with a frequency within the RF band, or more particularly in this case, the ultra high frequency (UHF) band, i.e., 300 MHz to 3000 MHz, into a number of related outputs is accomplished by applying a "Wilkinson" technique. The Wilkinson technique is a process by which an input signal is split through the use of one-quarter (¼) wavelength impedance matching transformers and output impedance lines. Referring to FIG. 1, a Wilkinson four way signal splitter is illustrated therein.

The Wilkinson signal splitter, indicated generally by the numeral 10, comprises a single input port 12 with four corresponding output ports 14, 16, 18, 20, and four resistive elements 22, 24, 26, 28, respectively, as well as their associated interconnections. As was previously mentioned, any number, n, of output ports can be derived, although a four way splitter will be used to describe the aforementioned technique. Additionally, each of the abovementioned circuit elements, i.e., the resistive elements, interconnections, etc., may be fabricated in a number of ways and will be described in greater detail hereinbelow.

The input port 12 of the device is connected to a junction point 30 via an input line 32. Four legs 34, 36, 38, 40 connect, at one end, to junction point 30, and at another end, to their corresponding resistive elements 22, 24, 26, 28 at connecting points 42, 44, 46, 48, respectively. Each of the four legs 34, 36, 38, 40 has a length substantially equal to a quarter of the wavelength of the expected signal. Thus, each Wilkinson signal splitter 10 has a limited frequency bandwidth due to this physical configuration. Furthermore, the legs 34, 36, 38, 40 and line 32 are constructed such that their impedance values, when combined, will result in a effective impedance value of the circuit, such as fifty ohms. Hence, as a greater number of outputs n is desired, the individual impedance of each leg and line must be increased.

The resistive elements 22, 24, 26, 28, whose resistive value also can be varied with circuit requirements, are all connected at one end to a single common termination point 50. The opposite end of each resistive element 22, 24, 26, 28 is connected to its corresponding leg 34, 36, 38, 40 at connecting points 42, 44, 46, 48. The resistive elements 22, 24, 26, 28 provide port to port isolation as well as proper impedance matching. Legs 34, 36, 38, 40, together with input line 32 comprise the impedance matching transformers.

Four additional impedance lines, output lines 52, 54, 56, 58, are connected at one end to the resistive elements 22, 24, 26, 28 at connecting points 42, 44, 46, 48. The opposite end of each output line 52, 54, 56, 58 is connected to its associated output port 14, 16, 18, 20. Each of the four impedance lines 52, 54, 56, 58 will have an impedance value equal to that of the RF circuit (typically fifty ohms).

Thus, an input signal of the appropriate frequency range applied to input port 12 will be split into four corresponding output signals, all retaining the same signal characteristics with the exception of power level.

Components designed to operate at UHF are commonly fabricated utilizing a printed circuit board, or PCB. The term "PCB", it must be understood, is used as a generic expression for boards which are utilized to retain circuit components and alloy conductive material to be connected between them. Although various types of PCBs can be utilized, PCBs for UHF applications are generally comprised of three elements: (1) a dielectric substrate element, which provides the "board" substance to mount the components upon; (2) a ground plane element, which covers one side of the substrate; and (3) a conductive material element, which interconnects the various circuit components. The three elements may be configured in different ways to produce desired effects in the circuit.

When designing and building RF circuits, a multiplicity of parameters must be taken into account for the circuit to function as desired. These parameters include impedance matching, insertion loss, and isolation between ports. When operating at UHF frequencies, the manner in which the PCB is designed relates directly with the manner in which the circuit functions. Each of the three PCB elements interact to form a transmission line for the UHF signals. Thus, if one of the three elements is modified, the other two elements must be changed to compensate for it or a different result will occur.

As previously mentioned, the common and desired PCB configuration for the manufacture of RF components comprises a non-conducting, dielectric substrate board element, a ground plane element, and a conductive material element.

The dielectric substrate is flat and is sized to accommodate the necessary circuit components. Its thickness and material make-up combine in affecting the circuit's results.

On one side of the PCB is the ground plane element. Ideally, for best circuit results, the ground plane element covers the entire PCB side. This produces a controlled impedance for better impedance matching allowing for accurate circuit predictability by the designing engineer.

On the opposite side of the PCB, the components are mounted. The conductive material, which can be copper, silver, or the like, is run to the appropriate positions on the board. The conductor's positioning on the board, cross-sectional area, and physical composition also combine to affect the circuit's resulting output. Thus, these factors are varied to produce transmission lines of different impedance values.

The process by which the conductor pattern is deposited upon the PCB most typically is done by photolithography. This process includes a number of steps including the fabrication of a photo-mask in the pattern of the desired conductor runs, the application of a photo-resist in areas where the conductive material will not be applied, and the deposition of conductive material. Upon completion of this multi-step process, a desired conductor pattern has been deposited upon the dielectric substrate.

The conductive material may or may not be be covered with a dielectric and a ground plane on the board. A conductor which utilizes a second dielectric substrate and ground plane is known in the field as "stripline". But, the use of stripline results in difficult testing, i.e., the test engineer must remove the ground plane and dielectric each time a change in the circuit is required. Also, only the input and output points are available for probing as test points, due to accessability. Additionally, stripline is more costly than conductive material without the additional dielectric and ground plane. Thus, stripline is not the preferred method used with RF circuits on PCBs.

To circumvent the problems associated with the stripline but still utilize the benefits of the additional dielectric and ground plane, a method of interconnecting components called "microstrip" is utilized. Microstrip is simply comprised of the three elements of the preferred PCB, i.e., a dielectric substrate, a ground plane, and a conductive material. Following the completion of the circuit, the board is placed in a conductive housing, or "RF can", thus providing a second ground plane (the housing) and dielectric (the air in the housing) to the circuit, which has negligible effects on the performance of the circuit operation. Consequently, because an engineer can probe the circuit during testing before the circuit is inserted in the "RF can " without having to remove a ground plane and dielectric substrate, the microstrip method of circuit interconnection is a preferred method utilized in the RF component industry.

Both microstrip and stripline have certain disadvantages. Specifically, when impedance lines must cross one another, an insulator must be placed between them to prevent short circuiting. This presents a problem for those circuits which require the crossing of conductors.

The Wilkinson type power divider 10, described previously, is such a device. As can be seen clearly in FIG. 1, and as was described hereinabove, the four legs 34, 36, 38, 40 extend from the junction point 30 to their associated connecting points 42, 44, 46, 48, respectively. Because the desired layout of the resistive elements 22, 24, 26, 28 includes their termination at a single termination point 50, two legs 34, 40 must cross the two remaining legs 36, 38 at cross-over points 60, 62, respectively.

As was previously discussed, this cross-over cannot be accomplished using microstrip or stripline because there would be a short circuit between the corresponding impedance lines. Additionally, legs 34, 40 cannot be routed beneath the resistive elements 24, 26 because electromagnetic coupling will occur between the legs 34, 40 and the elements 24, 26. This will annul the port to port isolation between the impedance lines, that is, the signals present on the legs 34, 40 will couple onto elements 24, 26 and vice versa.

A number of methods have been ascertained to avoid the microstrip intersection and electromagnetic cross-coupling problems. Two, which are most practical, are utilized presently. First, microwave cabling, connected at the appropriate points, may be utilized. Second, the conductive material may be routed through to the opposite side of the dielectric via feed through holes. Both are described in greater detail hereinbelow.

Because the prior art signal splitters, as well as the signal splitter of the present invention, are embodiments of the Wilkinson type signal splitter 10, the elements of each splitter will be described using the same numerals as the corresponding elements of the Wilkinson splitter 10 followed by an additional letter. The first prior art signal splitter, i.e., the splitter utilizing microwave cabling, will be described using the same numerals as were used to describe the schematic diagram of the Wilkinson signal splitter 10 followed by the letter A, or splitter 10A. The letters B and C will be used by the second prior art signal splitter, i.e., the splitter utilizing feed through holes, and the present invention. This should aid in the understanding of the devices and the differences between them.

Referring to FIG. 2, a four way signal splitter of the prior art utilizing microwave cabling is therein illustrated. It is generally indicated by the numeral 10 followed by the letter A. The four way splitter 10A comprises four resistive elements 22A, 24A, 26A, 28A mounted on a dielectric substrate 64A, interconnected by impedance lines. The preferred resistive elements 22A, 24A, 26A, 28A are "chip" resistors, which are manufactured resistive elements of various resistive values housed in a mountable package, i.e., a flat-pack package, a plug-in package, etc. Other types of resistors may be used, such as standard carbon composition resistors, but this would introduce unnecessary additional considerations, such as inductance in the resistor leads. The resistive values are chosen based upon the impedance of the circuit, in this case, fifty (50) ohms. The resistive elements 22A, 24A, 26A, 28A are connected to a common termination point 50A, and extend radially outward therefrom.

As was previously mentioned, the resistive elements 22A, 24A, 26A, 28A are mounted on a dielectric substrate 64A. The type of dielectric substrate chosen is also left to the designer's discretion. The dielectric 64A is formed in a board shape, that is, thin with two large flat surfaces. FIG. 2 shows the top of the dielectric 64A as the bottom of the dielectric 64A, not shown, is covered with a ground plane, a thin coating of conductive material. Attached directly to the dielectric 64A, at an input port 12A and output ports 14A, 16A, 18A, 20A, are five RF connectors 66A. The RF connectors chosen may be of various types, such as TNC, BNC, SMA, etc.

Two types of transmission lines are utilized in this embodiment: (1) microstrip and (2) microwave cable. Microstrip is used for input line 32A, legs 34A, 40A, and output lines 52A, 54A, 56A, 58A, while the remaining two legs 36A, 38A comprise microwave cable. Each leg 34A, 36A, 38A, 40A, as in all Wilkinson signal splitters, has a length substantially equal to one-quarter of the wavelength of the expected signal. The microstrip is connected, first, to a junction point 30A and, second to connecting points 42A, 48A along the top surface of the dielectric 64A. The microwave cabling, which is normally a coaxial line, is connected, first, to junction point 30A and, second, to connecting points 44A, 46A.

Although this embodiment solves the two abovementioned problems of microstrip cross-over and electromagnetic cross-coupling, it renders a manufacturing process which is more expensive. Because microwave cabling is used, additional hardware must be purchased thus increasing the material cost. Additional time must be spent to assemble the unit. Finally, engineering and test time must be used to ensure solid connections and adequate grounding of the cabling.

Thus, the utilization of microwave cabling results in a splitter which takes a long time to build and is relatively expensive.

Referring now to FIG. 3, a four way splitter of the prior art utilizing feed through holes is therein illustrated. It is generally indicated by the numeral 10 followed by the letter B. As in the splitter 10A, the splitter 10B comprises four resistive elements 22B, 24B, 26B, 28B mounted on a dielectric substrate 64B, interconnected by conductive material. RF connectors 66B are attached to the dielectric 64B at the input port 12B and output ports 14B, 16B, 18B, 20B.

In splitter 10B, a single type of transmission material is used, microstrip. To circumvent the cross-over and coupling problems inherent in the Wilkinson type signal splitter, the splitter 10B utilizes both sides of the dielectric 64B to route the microstrip to its appropriate destination without cross-over or cross-coupling.

Similar to hereinabove discussed device 10A, the splitter 10B has an input line 32B, legs 34B, 40B, and output lines 52B, 54B, 56B, 58B which are run on the top side of the dielectric 64B. Legs 34B, 40B are connected, first, to a junction point 30B and, second, to connecting points 42B, 48B. Legs 36B, 38B are fed through the dielectric substrate 64B via feed through holes 68, 70, respectively. Two feed through holes 68, 70 are used to describe this prior art embodiment, but a single larger feed through hole through which both legs are fed may be utilized and remain functionally equivalent. The feed through holes 68, 70 are located proximately to the junction point 30B. On the opposite side of the dielectric 64B, the ground plane is masked during fabrication in the areas where the two lines 36B, 38B are run.

Two additional feed through holes 72, 74 are utilized to route the two legs 36B, 38B to the top surface of the dielectric 64B. The two additional feed through holes 72, 74 are located proximately to their corresponding connecting points 44B, 46B, respectively, where the legs 36B, 38B are connected.

Although this embodiment solves the two abovementioned problems of microstrip cross-over and electromagnetic cross-coupling, it also renders a manufacturing process which is time-consuming and costly. First, a large amount of engineering time is involved prior to fabrication due to the additional considerations of the feed through holes in the dielectric substrate and the non-uniform ground plane. These factors must be considered when calculating certain electrical characteristics of the device, such as transmission line impedance, insertion loss, etc.

Second, because feed through holes are utilized, additional time must be spent to fabricate each unit. Moreover, an additional mask must be made for the bottom of the dielectric 64B to allow for legs 36B, 38B. This requires additional manufacturing time.

Finally, engineering and test time must be used to ensure a controlled impedance over the unit which might be disrupted by the various irregularities in the ground plane and dielectric substrate.

Thus, the utilization of feed through holes results in a splitter has a substantial manufacturing time, is relatively expensive, and can have unpredictable results.

Therefore, it can clearly be seen that an effective RF signal splitter utilizing only microstrip on a single PCB surface will have distinct economic and qualitative benefits over the prior art signal splitters.

SUMMARY OF THE INVENTION

The present invention incorporates a signal splitter with a single input and 'n' outputs using the 'Wilkinson' technique on a PCB using a single side of the board without the use of cabling. The invention utilizes a unique technique to circumvent the problems associated with the prior art splitters. Conductive material is run beneath and orthogonal to at least one of the resistive elements, used on the circuit for impedance matching. In this manner, no cross-coupling between the conductive lines and the resistive elements occurs because the electromagnetic fields generated around each element are orthogonal. Furthermore, because the conductive lines are run beneath the resistive elements, no conductor cross-over occurs.

Because the invention employs a single side of the PCB, the opposite side can remain completely covered with ground plane material, thus allowing for a controlled impedance and enhancing the impedance matching characteristic of the device. Furthermore, because there are no irregularities in the dielectric substrate and the ground plane is uniform, accurate predictions regarding voltage standing wave ratio (VSWR), return loss, port to port isolation, and other circuit characteristics may be formulated. This allows an RF engineer to precisely forecast the splitter's electrical characteristics without the need for extensive circuit testing and modifying, or 'tweeking', as is necessary with splitters utilizing the microwave cabling and feed through hole methods. Thus, the invention will dramatically reduce both manufacturing time and cost while allowing production of a higher quality device.

Because the device uses no additional cabling, the labor costs of assembling the device during the manufacturing process are reduced, as are the material costs. Additionally, the device will perform best with minimal interconnections.

Because the device utilizes a single side of the PCB for conductive runs, no feedthrough holes need to be drilled and only a single complex photolithographic process needs to be performed thus reducing the manufacturing time and cost.

This combination of useful features for an n-way signal splitter is not believed to be disclosed or suggested by any prior art patents and, therefore, a primary objective of this patent is to provide an improved n-way signal splitter utilizing a single side of a dielectric substrate without the need for cabling.

It is another object of the present invention to provide an improved signal splitter utilizing only microstrip transmission lines without the use of feedthrough holes.

The above and other objectives and advantages of the invention will become more apparent upon reading the description of the invention in connection with the drawings described hereinbelow.

DESCRIPTION OF THE PREFERRED EMBODIMENT

Figure 1:
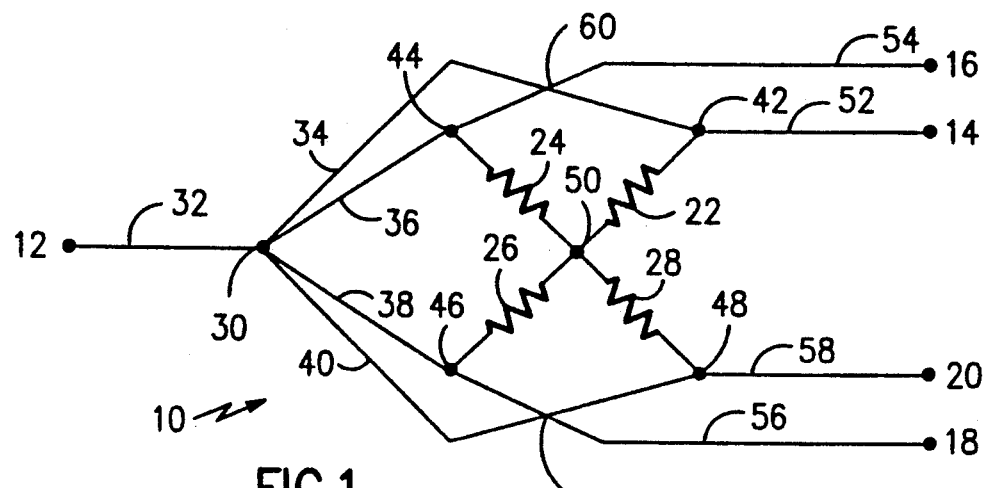
FIG. 1 is a schematic diagram of a four way signal splitter of the prior art using the 'Wilkinson' technique.
Figure 4:
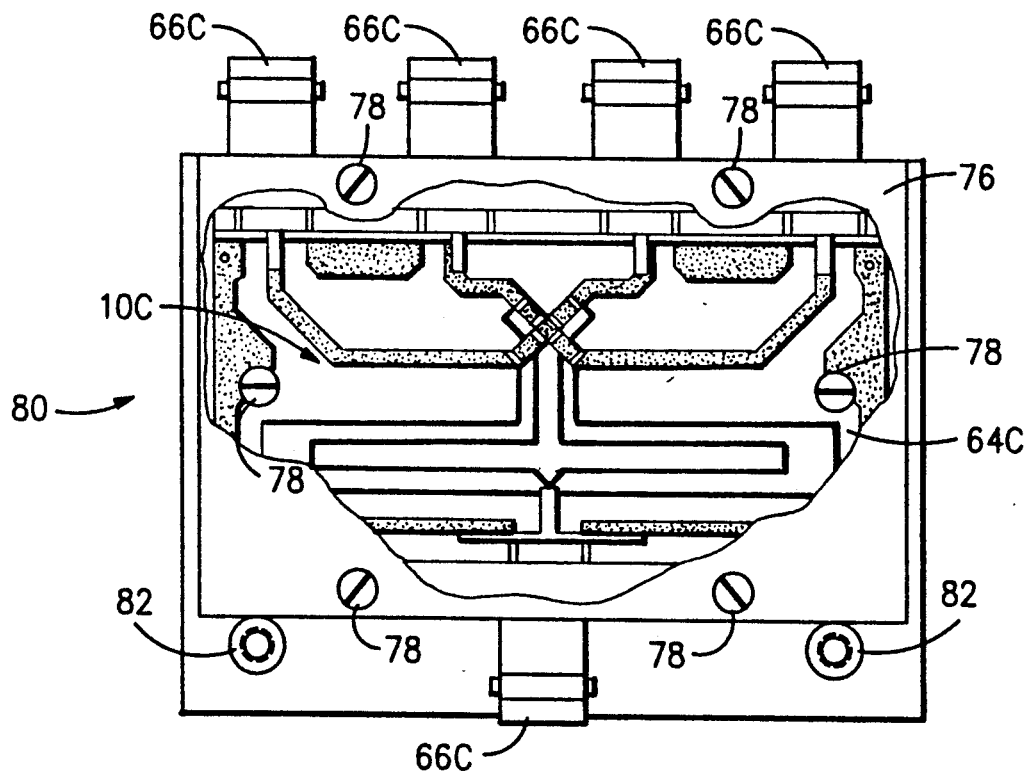
FIG. 4 is a top plan view of a four way signal splitter of of the present invention shown in a housing with a cover partially removed.
Figure 2:
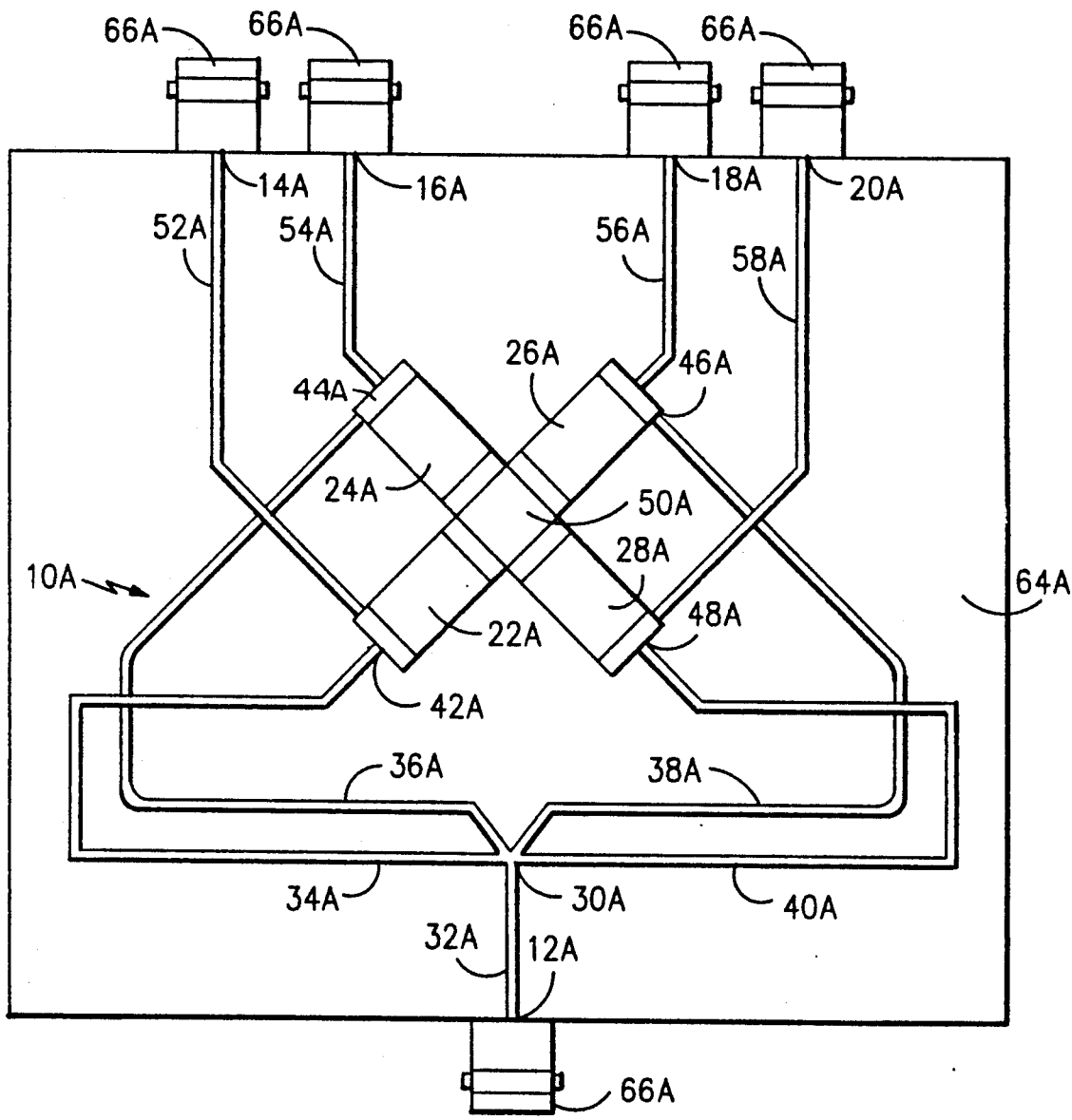
FIG. 2 is a top plan view of a four way signal splitter of the prior art.
Figure 3:
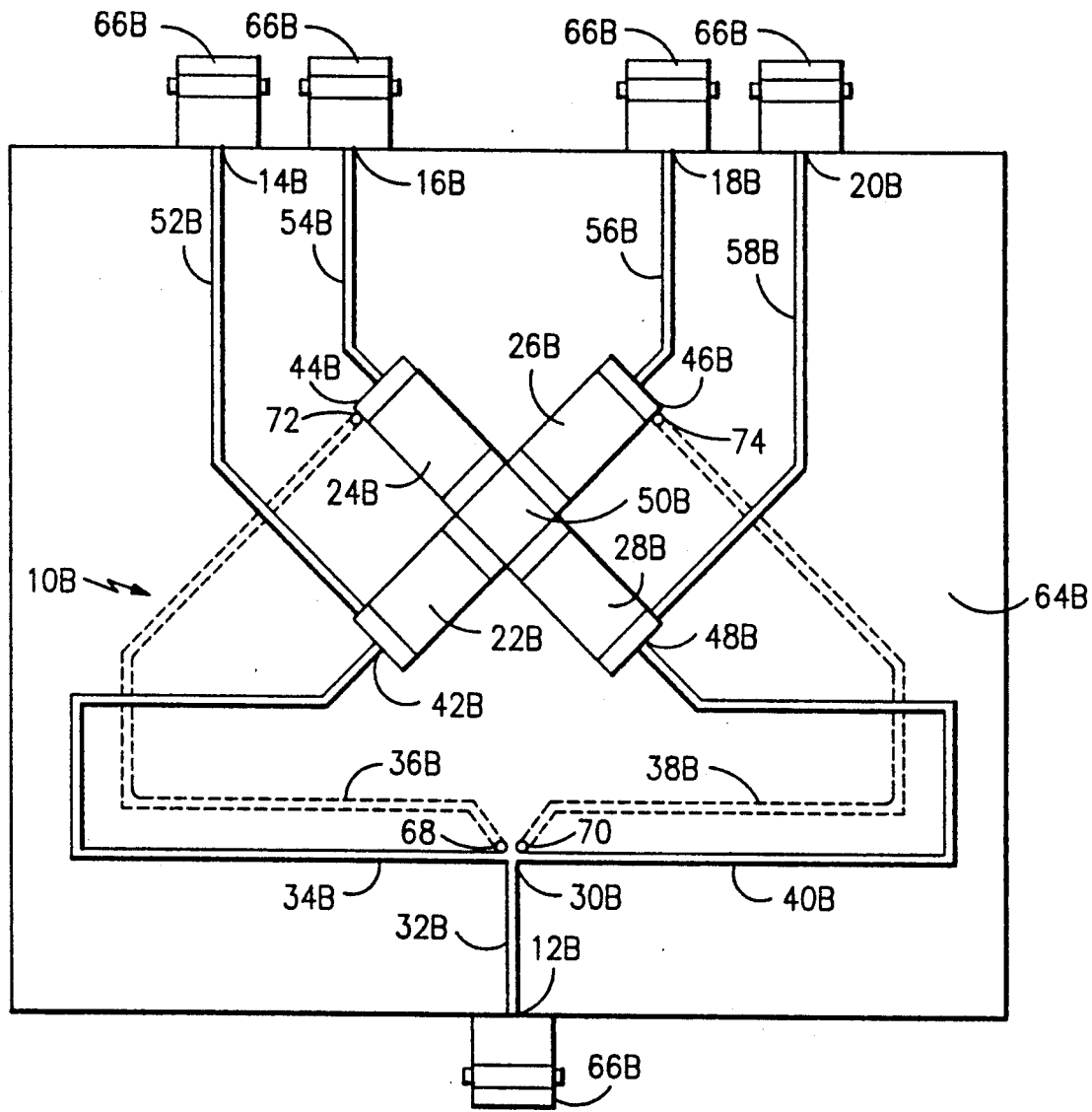
FIG. 3 is a top plan view of another four way signal splitter of the prior art.

Referring first to FIG. 4, a four way splitter of the present invention, indicated generally by the numeral 10 followed by the letter C, is therein illustrated. It is shown in a fully assembled configuration in a housing 76, which is in partial cross section. The splitter 10C, which is fabricated upon a dielectric substrate 64C, is mounted within the housing 76 using mounting hardware 78. The complete assembly, including splitter 10C, dielectric substrate 64C, housing 76, RF connectors 66C, and mounting hardware 78, is indicated generally by the numeral 80.

The housing 76, which is made of sheet metal or some other conductive material, provides a second ground plane for the splitter 10C, while the air within the housing 76 provides a second dielectric for the splitter 10C. The housing 76 also provides a means for attaching the assembly 80 within an RF system via attachment holes 82.

RF connectors 66C are mounted to the housing 76 and are also attached to the dielectric substrate 64C within the assembly 80. The connectors 66C provide access to the splitter 10C from without the housing 76.

Figure 5:
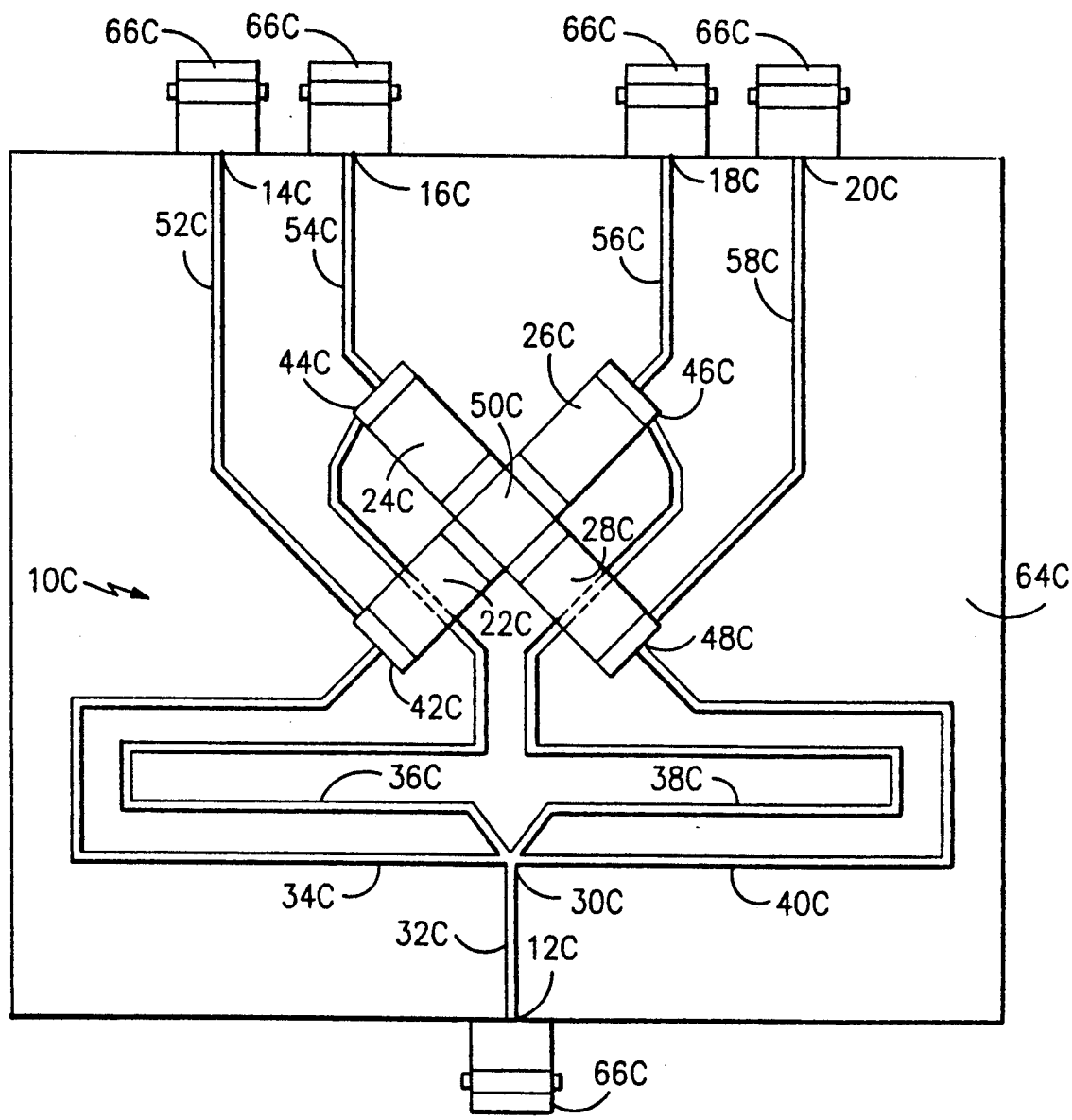
FIG. 5 is a top plan view of the device of FIG. 4, showing a microstrip and termination layout.

Referring now to FIG. 5, therein is illustrated the signal splitter 10C of the present invention shown fabricated on a dielectric substrate 64C. For clarity, the housing 76 and mounting hardware 78 are not shown, while the RF connectors 66C are positioned as they would be in the assembly 80.

The signal splitter 10C, utilizing the Wilkinson technique of impedance matching transformers and output impedance lines,, comprises a single input port 12C with four corresponding output ports 14C, 16C, 18C, 20C, and four resistive elements 22C, 24C, 26C, 28C, respectively. The input port 12C of the device is connected to a junction point 30C via an input line 32C. It should be noted, however, that the input port 12C is not required in an actual splitter, i.e., the RF connector 66C at input port 12C might be connected directly to the junction point 30C, and is shown mainly for clarity. Four legs 34C, 36C, 38C, 40C connect, at one end, to junction point 30C, and at another end, connect to their corresponding resistive elements 22C, 24C, 26C, 28C at connecting points 42C, 44C, 46C, 48C, respectively. As in all Wilkinson signal splitters, each of the four legs 34C, 36C, 38C, 40C has a length substantially equal to a quarter of the wavelength of the expected signal.

The resistive elements 22C, 24C, 26C, 28C are all connected at one end to a single common termination point 50C. The opposite end of each resistive element 22C, 24C, 26C, 28C is connected to its corresponding leg 34C, 36C, 38C, 40C at connecting points 42C, 44C, 46C, 48C. Legs 34C, 36C, 38C and 40C, together with input line 32C comprise the impedance matching transformers.

Four additional transmission lines, output lines 52C, 54C, 56C, 58C, are connected at one end to the resistive elements 22C, 24C, 26C, 28C at connecting points 42C, 44C, 46C, 48C. The opposite end of each output line 52C, 54C, 56C, 58C is connected to its associated output port 14C, 16C, 18C, 20C. It should be noted that, as with the input line 12C, the output impedance lines 52C, 54C, 56C, 58C are not required for a functional circuit, but rather are utilized to allow easier access to connecting points 42C, 44C, 46C, 48C.

As distinguished from the prior art devices 10A, 10B, all four legs 34C, 36C, 38C, 40C are routed to their associated resistive elements 22C, 24C, 26C, 28C utilizing conductive material on the top surface of the dielectric substrate 64C. This is accomplished without any conductor cross-over and without substantially any cross-coupling between the four signal lines.

As shown in FIG. 5, the conductive legs 34C, 40C are routed in the same manner as described previously. But legs 36C, 38C are routed, using conductive material upon the top surface of the dielectric substrate 64C, beneath resistive elements 22C, 28C, respectively. Because the preferred resistive elements are standard chip resistors as used in the prior art splitters, which are housed in insulating material, no conduction will occur between the resistive elements 22C, 28C and the legs 36C, 38C. Furthermore, substantially no cross-coupling will take place between the elements 22C, 28C and the legs 36C, 38C because of the geometric layout of the components on the substrate 64C. The two legs 36C, 38C are configured beneath the two resistive elements 22C, 28C at mutually orthogonal angles. This results in the legs 36C, 38C being electromagnetically isolated from the resistive elements 22C, 28C. Because the current flow in the conductive legs 36C, 38C is orthogonal to the current flow in the two resistive elements 22C, 28C, their respective electromagnetic fields are orthogonal to each other and, consequently, the coupling between the elements is zero. It should be noted, however, that zero cross-coupling takes place in an ideal situation, i.e., perfectly orthogonally situated elements, ideal physical characteristics of each device, etc., and such a situation cannot exist. But, in a real environment, the cross-coupling will be negligible.

Figure 6:
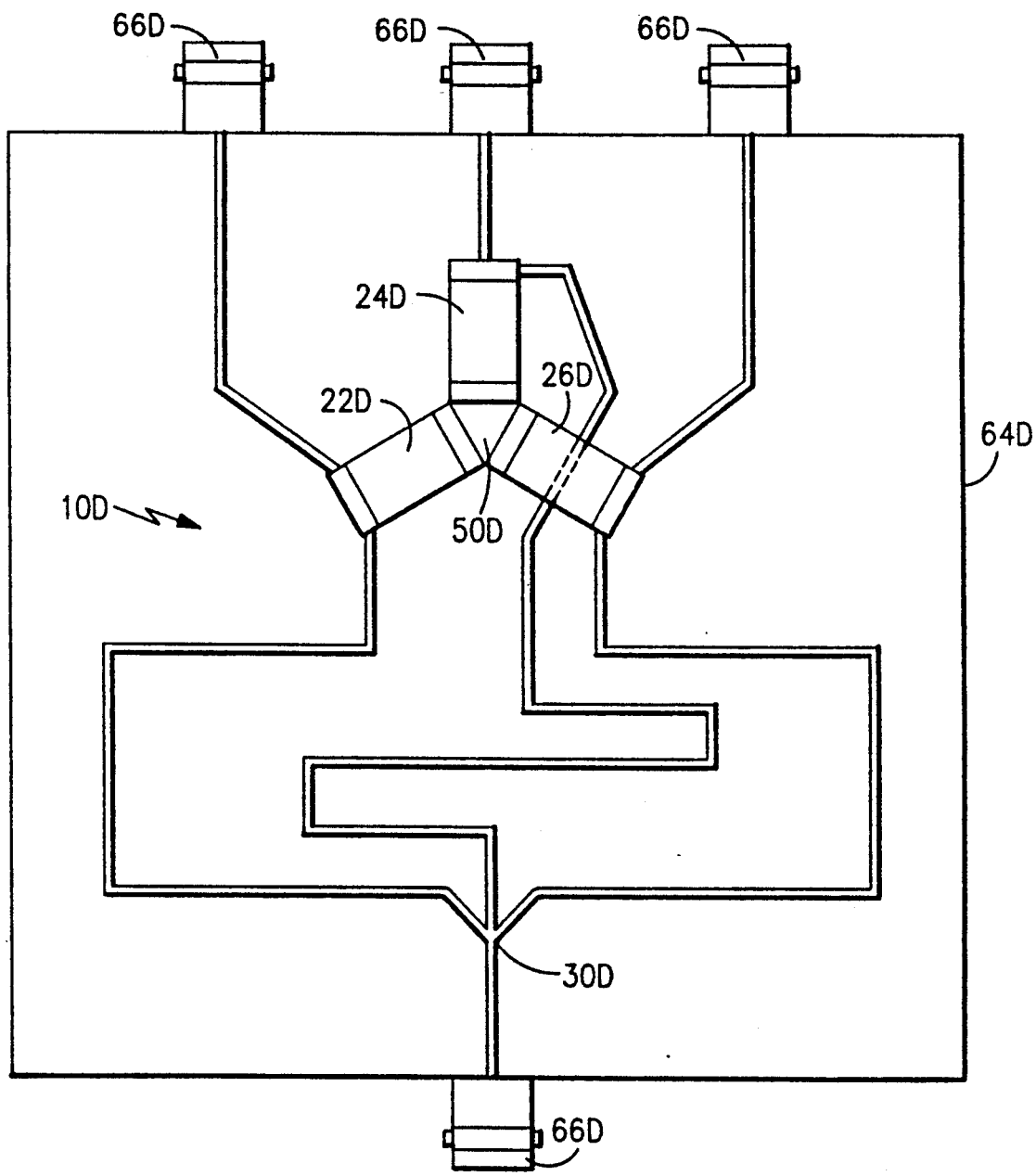
FIG. 6 is a top plan view of a three way signal splitter of the present invention, showing a microstrip and termination layout.
Figure 7:
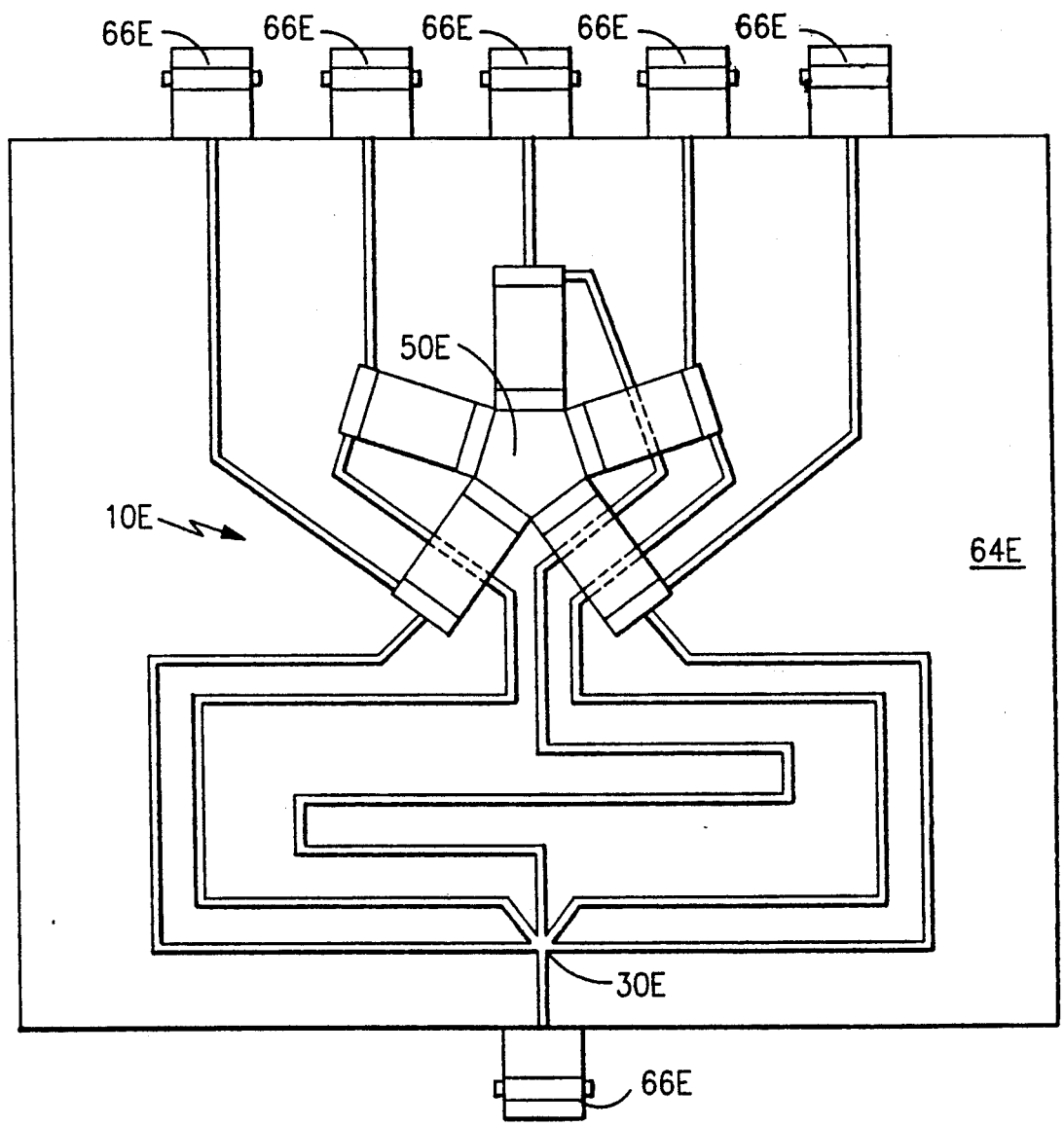
FIG. 7 is a top plan view of a five way signal splitter of the present invention, showing a microstrip and termination layout.

Referring now to FIGS. 6 and 7, therein are illustrated two additional signal splitters 10D and 10E of the present invention. Both figures show similar components and, more importantly, similar geometric layouts, i.e., conductive runs connected, at one end, at junction point 30D, 30E, and occurring beneath resistive elements 22D, 24D, 26D as shown in FIG. 6, at mutually orthogonal angles, thus allowing all impedance lines to be fabricated on one surface of each dielectric substrate 64D, 64E. As in device 10C, the resistive elements are all connected to a common termination point 50D, 50E, each of the outputs are connected to RF connectors 66D, 66E, and the opposite sides of the substrates 64D, 64E of devices 10D, 10E are covered with a ground plane.

Additionally, this technique may be utilized to fabricate devices which can split a signal into any number of outputs, although practical concerns might constrain this.

Because the present invention incorporates a signal splitter using the Wilkinson technique on a single side of a dielectric substrate, without additional cabling or components, and with a high degree of port to port isolation, a number of advantages are gained over the prior art techniques. First, because the bottom surface of the dielectric is entirely a ground plane, the device has a controlled impedance. The device will, therefore, have a fixed characteristic impedance and be more capable of impedance matching with other components within the RF system. Next, because feed through holes and microwave cabling are not utilized, the electrical characteristics of the device may be precisely predicted, allowing the manufacture of such devices without labor intensive testing and troubleshooting. Finally, because no additional holes need to be drilled and only a single photolithographic process and no additional hardware is required, the labor and material cost of each unit is minimized, thereby providing an improved splitter at a lower cost.

What is claimed is:

1. An electrical circuit for splitting a first radio frequency signal into a plurality of radio frequency signals, comprising:

a dielectric substrate having first and second surfaces; and, means disposed on said first surface for receiving and splitting a first radio frequency signal into at least three radio frequency signals, said means comprising at least three impedance matching transformers and at least three resistive elements having first and second ends, each said resistive element corresponding to one of said transformers, each said impedance matching transformer comprising a line of conductive material of a specific length and impedance value having first and second ends, said first end of each line of conductive material connecting to said first end of each corresponding resistive element at a corresponding connecting point, each connecting point providing to the circuit an output for one of said plurality of radio frequency signals, said second end of each line of conductive material connects to a common junction point, said junction point providing an input to the circuit for said first radio frequency signal, said second end of each resistive element connects at a common point, said resistive elements extending from said common point and a portion of said conductive material of at least one of said impedance matching transformers being disposed beneath and substantially orthogonal to at least one of said resistive elements.

2. A circuit as described claim 1, wherein said said second surface of said dielectric substrate is covered with a thin film of conductive material.

3. A circuit as described claim 2, wherein said dielectric substrate comprises a printed circuit board.

4. A circuit as described claim 1, wherein said circuit further comprises a connector, said connector being attached to said junction point.

5. A circuit as described claim 1, wherein said circuit further comprises at least three connectors, each said connector being attached to each said corresponding impedance matching transformer at each said corresponding connecting point.

6. A circuit as described claim 5, wherein said circuit further comprises at least four connectors, each said connector being attached to each said corresponding impedance matching transformer at each said corresponding connecting point and said junction point.

7. A circuit as described claim 6, wherein said circuit further comprises a housing, whereby said housing encloses said dielectric substrate and said connectors are attached to said housing.

8. A circuit as described claim 1, wherein said circuit further comprises an input line having first and second ends, said first end of said input line connecting to said impedance matching transformers at said junction point, said second end providing to the circuit said input on said first radio frequency signal, said input line comprising a line of conductive material of a specified length and impedance value.

9. A circuit as described claim 8, wherein said circuit further comprises a connector, said connector being attached to said second end of said input line.

10. A circuit as described claim 1, wherein said circuit further comprises at least three output lines having first and second ends, said first end of each said output line connecting to each said corresponding impedance matching transformer at each said corresponding connecting point, each said second end providing said output for one of said plurality of radio frequency signals, each said output line comprising a line of conductive material of a specified length and impedance value.

11. A circuit as described claim 10, wherein said circuit further comprises at least three connectors, each connector being attached to said second end of each said corresponding output line.

12. A circuit as described claim 1, further comprising:

an input line having first and second ends, said first end connecting to said impedance matching transformers at said junction point, said second end providing to the circuit said input for said first radio frequency signal; and at least three output lines having first and second ends, each said first end connecting corresponding impedance matching transformer corresponding connecting point, each said second end providing to the circuit said output for said plurality of radio frequency signals wherein said input line and each said output line comprising a line of conductive material of a specified length and impedance value.

13. A circuit as described claim 12, wherein said circuit further comprises at least four connectors, one of said connectors being attached to said second end of said input line and each of the remaining said connectors being attached to said second end of each said corresponding output line.

14. A circuit as described claim 13, wherein said circuit further comprises a housing, whereby said housing encloses said dielectric substrate and said connectors are attached to said housing.

* * * * *

UNITED STATES PATENT AND TRADEMARK OFFICE
CERTIFICATE OF CORRECTION

PATENT NO. : 5,021,755

DATED : June 4, 1991

INVENTOR(S) : Warren H. Gustafson

It is certified that error appears in the above-identified patent and that said Letters Patent is hereby corrected as shown below:

```
At column 10, line 43, prior to "corresponding", please
insert --to each said--; and
at line 44, prior to "corresponding", please insert
--at each said--.
```

Signed and Sealed this

Fifteenth Day of September, 1992

Attest:

DOUGLAS B. COMER

*Attesting Officer*     *Acting Commissioner of Patents and Trademarks*